United States Patent [19]
Schneider et al.

[11] Patent Number: 6,081,469
[45] Date of Patent: Jun. 27, 2000

[54] COMBINED PRECHARGING AND HOMOGENIZING CIRCUIT

[75] Inventors: Helmut Schneider, München; Michael Wagner, Mittelstetten, both of Germany

[73] Assignee: Siemens Aktiengesellschaft, Munich, Germany

[21] Appl. No.: 09/374,894

[22] Filed: Aug. 13, 1999

[30] Foreign Application Priority Data

Aug. 13, 1998 [DE] Germany ............... 198 36 736

[51] Int. Cl.⁷ ...................................... G11C 7/00
[52] U.S. Cl. ............... 365/203; 365/204; 365/185.25
[58] Field of Search ................. 365/203, 204, 365/185.25

[56] References Cited

U.S. PATENT DOCUMENTS

| | | | |
|---|---|---|---|
| 4,570,083 | 2/1986 | Nakaizumi | 307/443 |
| 5,604,365 | 2/1997 | Kajigaya | 257/296 |
| 5,652,726 | 7/1997 | Tsukude | 365/203 |
| 5,986,955 | 11/1999 | Siek et al. | 365/203 |
| 5,995,434 | 11/1999 | Ryu | 365/222 |

*Primary Examiner*—David Nelms
*Assistant Examiner*—Connie C. Yoha
*Attorney, Agent, or Firm*—Herbert L. Lerner; Laurence A. Greenberg; Werner H. Stemer

[57] ABSTRACT

A combined precharging and homogenizing circuit for a semiconductor memory configuration made up of a memory cell array having a multiplicity of bit line pairs. The combined precharging and homogenizing circuit containing a first and a second field-effect precharging transistor and a homogenizing transistor connected in series between the two precharging transistors. Gates of the two precharging transistors and of the homogenizing transistor are connected together to form a common gate. Sources of the precharging transistors are connected together to form a common source. A drain of the first precharging transistor and a drain of the homogenizing transistor are connected together to form a common drain and the source of the homogenizing transistor and the drain of the second precharging transistor are connected together to form a common source/drain. In the combined precharging and homogenizing circuit, the invention provides that the common gate is angled and is configured rotated through about 45° in relation to a longitudinal direction of the bit lines. In addition, the common drain and the common source/drain are drawn forward beyond the common gate defining protruding regions, and that bit line contacts are accommodated in the protruding regions.

2 Claims, 3 Drawing Sheets

COMBINED PRECHARGING AND HOMOGENIZING CIRCUIT

BACKGROUND OF THE INVENTION

Field of the Invention

The invention relates to a combined precharging and homogenizing circuit for a semiconductor memory configuration made up of a memory cell array having a multiplicity of bit line pairs. The combined precharging and homogenizing circuit contains a first and a second field-effect precharging transistor and a homogenizing transistor connected in series between the two precharging transistors. The gates of the two precharging transistors and of the homogenizing transistor are connected together to form a common gate. The sources of the precharging transistors are connected together to form a common source. The drain of the first precharging transistor and the drain of the homogenizing transistor are connected together to form a common drain and the source of the homogenizing transistor and the drain of the second precharging transistor are connected together to form a common source/drain.

Such a combined precharging and homogenizing circuit is used, among other things, to precharge the bit lines of DRAM memory configurations in the inactive state to a predetermined potential and to homogenize the two bit lines of a bit line pair with a common write/read amplifier. In this configuration, the predetermined potential is set by the two precharging transistors, while the bit lines are homogenized by an equalizer transistor.

Existing combined precharging and homogenizing circuits have a relatively large distance between the two bit lines, which can be attributed to the space requirement for the precharging transistors, the homogenizing transistor and possibly a leakage current limiter. Reducing the large distance between the bit lines represents a central problem for the desire to reduce the overall size of the memory cells.

SUMMARY OF THE INVENTION

It is accordingly an object of the invention to provide a combined precharging and homogenizing circuit that overcomes the above-mentioned disadvantages of the prior art devices of this general type, which is distinguished by a low space requirement, so that the bit lines of a bit line pair can be routed closely next to one another result in better space utilization.

With the foregoing and other objects in view there is provided, in accordance with the invention, in combination with a semiconductor memory configuration having a memory cell array with bit lines, a combined precharging and homogenizing circuit for the semiconductor memory configuration, the combined precharging and homogenizing circuit including:

a first field-effect precharging transistor having a gate, a source and a drain and a second field-effect precharging transistor having a gate, a source and a drain;

a homogenizing transistor having a gate, a source and a drain, and connected in series between the first field-effect precharging transistor and the second field-effect precharging transistor;

the gate of the first field-effect precharging transistor, the gate of the second field-effect precharging transistor and the gate of the homogenizing transistor connected together forming a common gate, the common gate angled and rotated through about 45 in relation to a longitudinal direction of the bit lines;

the source of the first field-effect precharging transistor and the source of the second field-effect precharging transistor connected together forming a common source;

the drain of the first field-effect precharging transistor and the drain of the homogenizing transistor connected together forming a common drain;

the source of the homogenizing transistor and the drain of the second field-effect precharging transistor connected together forming a common source/drain;

the common drain and the common source/drain being drawn forward beyond the common gate defining protruding regions; and bit line contacts disposed in the protruding regions.

The invention achieves the object for the combined precharging and homogenizing circuit of the type mentioned in the introduction in that the common gate is angled and is configured rotated through about 45° in relation to the longitudinal direction of the bit lines, in that the common drain and the common source/drain are drawn forward beyond the common gate by the protruding regions, and in that the bit line contacts are accommodated in the protruding regions.

If necessary, a leakage current limiter can also be connected in series with the precharging transistors and the homogenizing transistor. The common gate can also be rotated through different angles than 45° in relation to the longitudinal direction of the bit lines. Hence, angles between 30° and 60°, for example, are readily conceivable.

The space requirement for the precharging and homogenizing circuit according to the invention is lower than the space requirement for existing precharging and homogenizing circuits. "Bending" the common gate, rotating it through about 45° and accommodating the bit line contacts in the regions that are drawn forward enables the distance between the bit lines to be reduced considerably and enables the homogenizing transistor to be dimensioned flexibly. This makes it possible to configure memory cells to be smaller and also to make the bit lines longer.

Other features which are considered as characteristic for the invention are set forth in the appended claims.

Although the invention is illustrated and described herein as embodied in a combined precharging and homogenizing circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
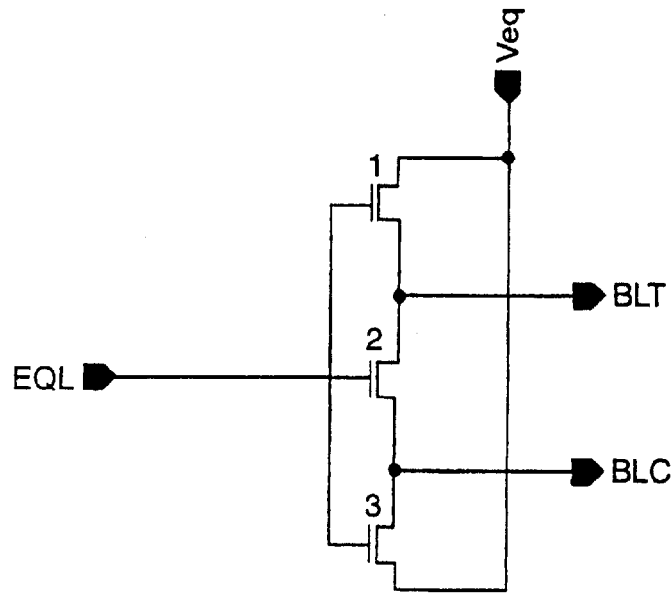
FIG. 1 is a diagrammatic, circuit diagram of a first example of a precharging and homogenizing circuit according to the invention.

In all the figures of the drawing, sub-features and integral parts that correspond to one another bear the same reference symbol in each case. Referring now to the figures of the drawing in detail and first, particularly, to FIG. 1 thereof, there is shown a combined precharging and homogenizing circuit having precharging transistors 1 and 3, between which a homogenizing transistor 2 is provided in series. The transistor 2 receives a signal EQL at its gate, while ends of a series circuit formed by the transistors 1 to 3 are at a potential Veq. Gates of the transistors 1 and 3 are connected together, and the common nodes between the transistors 1 and 2, and 2 and 3, respectively, are connected to bit lines BLT and BLC, respectively, of a bit line pair. The bit lines are activated in the usual manner by applying a signal EQL and a signal ISO to non-illustrated transistors provided in the bit lines.

Figure 2:
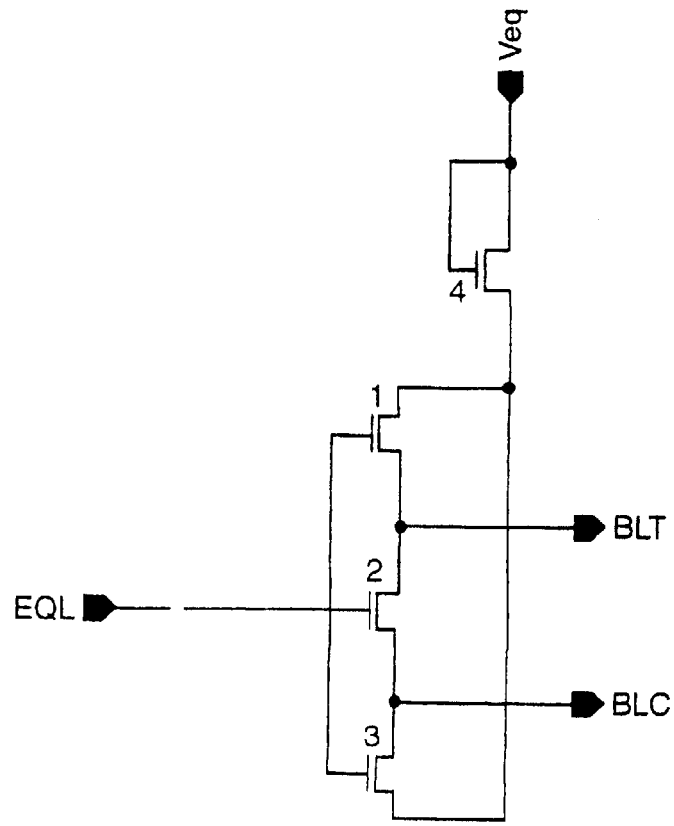
FIG. 2 is a circuit diagram of a second example of the precharging and homogenizing circuit.

The circuit shown in FIG. 2 is additionally provided with a leakage current limiter 4 in the form of a transistor, which acts as a resistor and is connected in series with the transistors 1 to 3.

Figure 3:
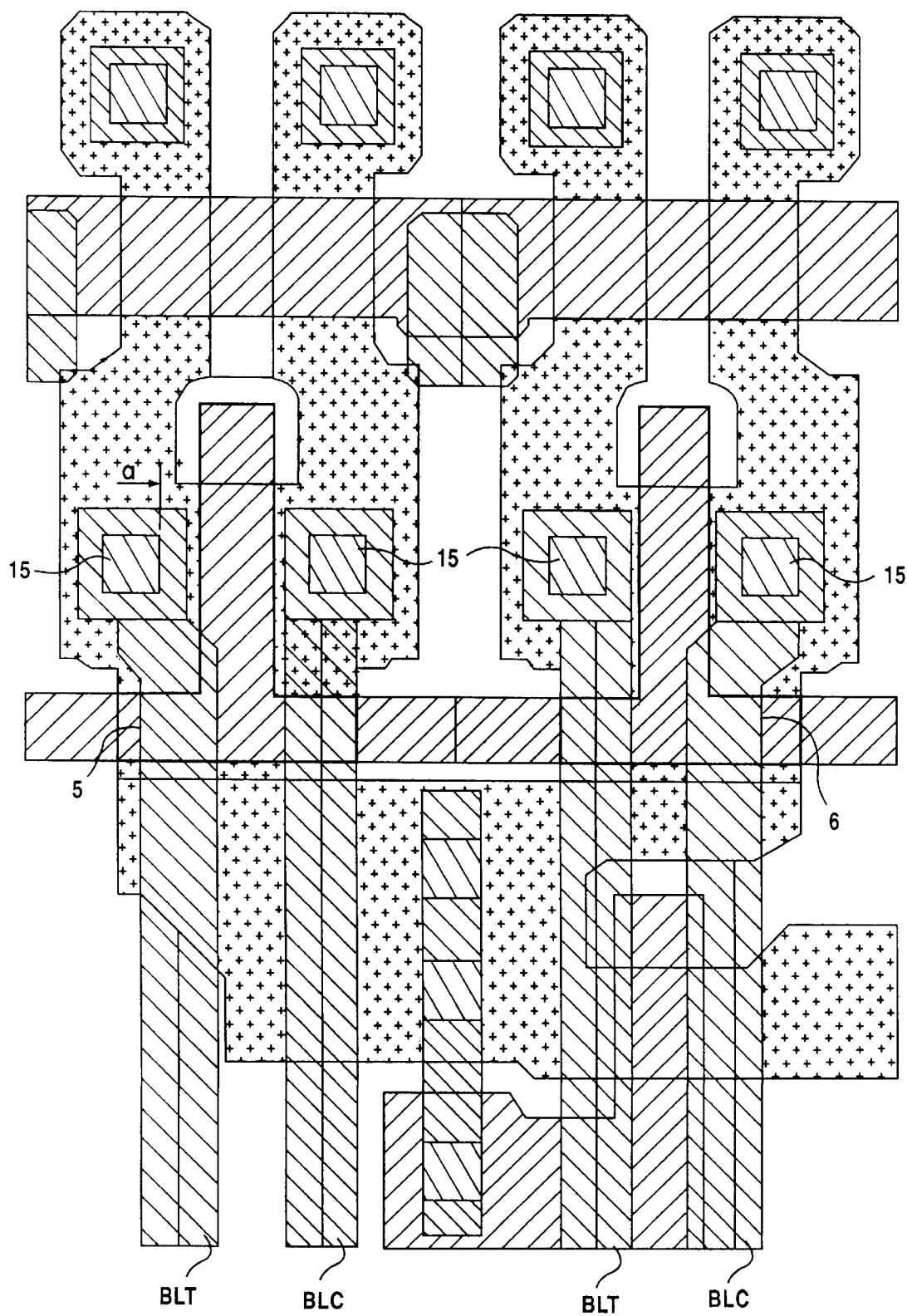
FIG. 3 is a plan view of a prior art gate structure for the circuit n in FIG. 1.

As can be seen in FIG. 3, in an existing circuit, gates 5, 6 of the transistors 1 to 3 are essentially of angled "T"-shaped configuration. Sources of the two transistors 1 and 3 are disposed on the left of the crosspiece of the "T", and a drain of the precharging transistor 1 and a drain of the homogenizing transistor 2, and a source of the homogenizing transistor 2 and a drain of the precharging transistor 3, respectively, are disposed on mutually opposite sides of the stem of the "T". Bit line contacts 15 for the bit lines BLT, BLC are disposed on both sides of the gates 5, 6 in this existing circuit.

Figure 4:
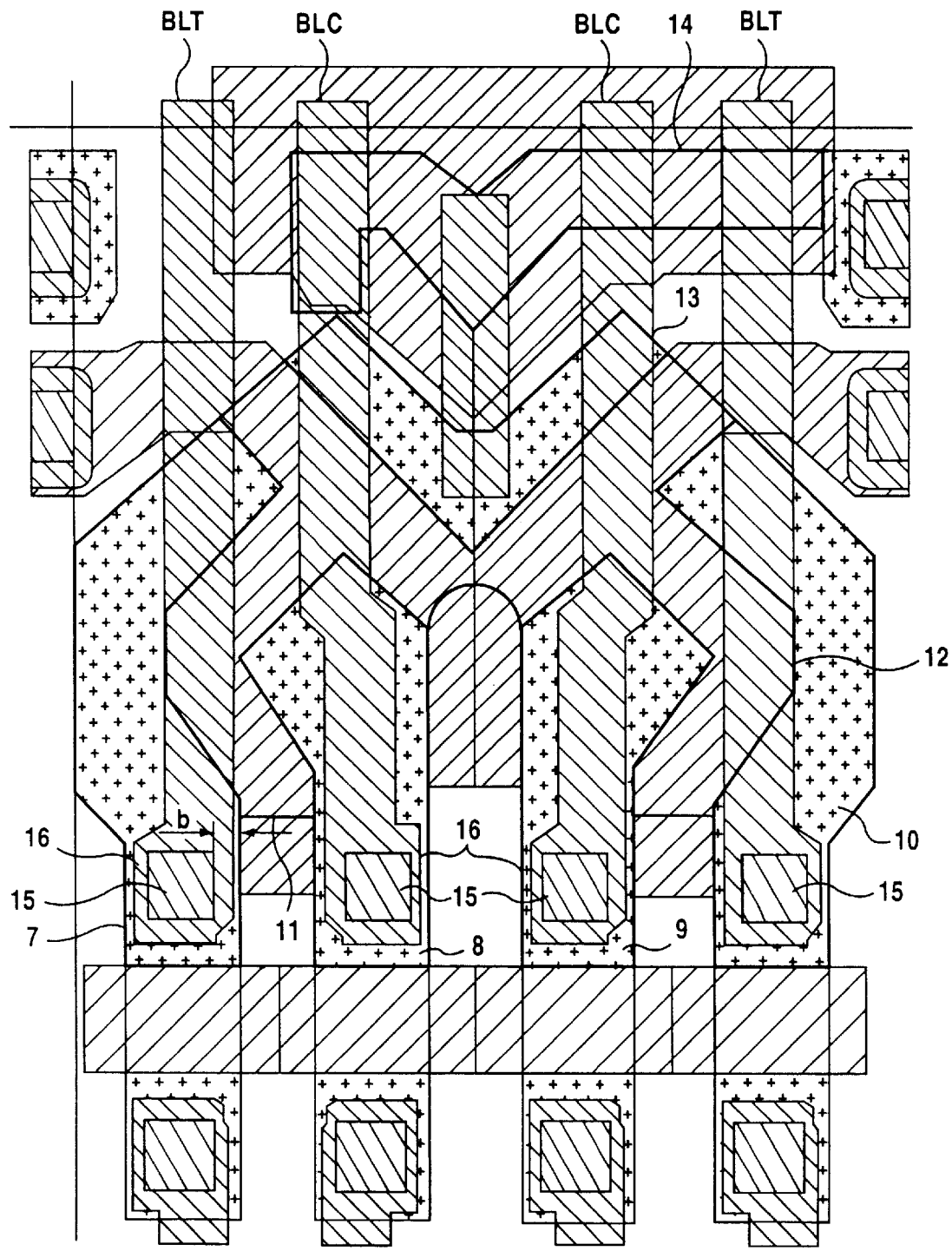
FIG. 4 is a plan view of a gate structure according to the invention for the circuit shown in FIG. 1.

FIG. 4 shows an exemplary embodiment of the invention with the sources 13 of the two precharging transistors 1, 3, the drain 7 (or 10) of the first precharging transistor 1 and of the homogenizing transistor 2, respectively, and the source 8 (or 9) of the homogenizing transistor 2 and the drain 8 of the second precharging transistor 3, respectively. That is to say that the drains of the first precharging transistor 1 and of the homogenizing transistor 2 are connected together to form a common drain 7 (or 10), and the source 8 (or 9) of the homogenizing transistor 2 and the drain 8 of the second precharging transistor 3 are connected together to form a common source/drain 8 (or 9). In addition, FIG. 4 also shows a gate 14 of the leakage current limiter 4.

In the circuit shown in the exemplary embodiment of FIG. 4, gates 11 (or 12) are not only angled but are additionally rotated through about 450 in relation to a longitudinal direction of the bit lines BLT and BLC. The angled and rotated configuration of the gates 11 (or 12) enables a space requirement for the precharging and homogenizing circuit to be reduced considerably, since the bit line contacts 15 can be "drawn out", so that the bit lines of the respective bit line pairs BLT, BLC can be routed closely next to one another.

The bit line contacts 15 are thus accommodated in protruding regions 16 of the common source/drain 8, 9 and of the common drain 7, 10, the protruding regions 16 extending beyond the common gate 11 and 12, respectively. In particular, a distance b between the bit line contact 15 and an edge of the polycrystalline material can be made smaller than in the prior art (see "a" in FIG. 3).

We claim:

1. In combination with a semiconductor memory configuration having a memory cell array with bit lines, a combined precharging and homogenizing circuit for the semiconductor memory configuration, the combined precharging and homogenizing circuit comprising:

a first field-effect precharging transistor having a gate, a source and a drain;

a second field-effect precharging transistor having a gate, a source and a drain;

a homogenizing transistor having a gate, a source and a drain, and connected in series between said first field-effect precharging transistor and said second field-effect precharging transistor;

said gate of said first field-effect precharging transistor, said gate of said second field-effect precharging transistor and said gate of said homogenizing transistor connected together forming a common gate, said common gate angled and rotated through about 45° in relation to a longitudinal direction of the bit lines;

said source of said first field-effect precharging transistor and said source of said second field-effect precharging transistor connected together forming a common source;

said drain of said first field-effect precharging transistor and said drain of said homogenizing transistor connected together forming a common drain;

said source of said homogenizing transistor and said drain of said second field-effect precharging transistor connected together forming a common source/drain;

said common drain and said common source/drain being drawn forward beyond said common gate defining protruding regions; and bit line contacts disposed in said protruding regions.

2. The combined precharging and homogenizing circuit according to claim 1, including a leakage current limiter connected in series with said first field-effect precharging transistor, said second field-effect precharging transistors and said homogenizing transistor.

* * * * *